United States Patent [19]
Law et al.

[11] Patent Number: 6,024,044
[45] Date of Patent: Feb. 15, 2000

[54] DUAL FREQUENCY EXCITATION OF PLASMA FOR FILM DEPOSITION

[75] Inventors: Kam S. Law, Union City; Robert M. Robertson, Santa Clara; Quanyuan Shang, San Jose; Jeff Olsen, Los Gatos; Carl Sorensen, Morgan Hill, all of Calif.

[73] Assignee: Applied Komatsu Technology, Inc., Tokyo, Japan

[21] Appl. No.: 08/948,279

[22] Filed: Oct. 9, 1997

[51] Int. Cl.$^7$ ................................................. C23C 16/50
[52] U.S. Cl. ................................ 118/723 E; 118/723 R; 156/345; 315/111.21
[58] Field of Search ................................ 118/715, 725, 118/723 E, 723 R; 156/345; 315/111.21

[56] References Cited

U.S. PATENT DOCUMENTS

| | | | |
|---|---|---|---|
| 4,854,263 | 8/1989 | Chang et al. | 118/715 |
| 5,271,972 | 12/1993 | Kwok et al. | 427/579 |
| 5,352,294 | 10/1994 | White et al. | 427/248.1 |
| 5,356,722 | 10/1994 | Nguyen et al. | 427/569 |
| 5,366,585 | 11/1994 | Robertson et al. | 156/643 |
| 5,399,387 | 3/1995 | Law et al. | 427/574 |
| 5,441,768 | 8/1995 | Law et al. | 427/255 |
| 5,464,499 | 11/1995 | Moslehi et al. | 216/71 |
| 5,508,067 | 4/1996 | Sato et al. | 427/579 |
| 5,571,571 | 11/1996 | Musaka et al. | 427/574 |
| 5,582,866 | 12/1996 | White | 427/248 |
| 5,584,971 | 12/1996 | Komino | 204/192.13 |
| 5,591,494 | 1/1997 | Sato et al. | 427/579 |
| 5,611,865 | 3/1997 | White et al. | 118/725 |

FOREIGN PATENT DOCUMENTS

| | | |
|---|---|---|
| 026604-A1 | 4/1981 | European Pat. Off. . |
| 605980-A2 | 7/1994 | European Pat. Off. . |
| 665306-A1 | 8/1995 | European Pat. Off. . |
| 7-045542 | 2/1995 | Japan . |

*Primary Examiner*—Timothy Meeks
*Attorney, Agent, or Firm*—Fish & Richardson

[57] ABSTRACT

An apparatus deposits a high quality film onto a transparent substrate in a reactor. The transparent substrate may be made of glass, quartz or a polymer such as plastic. The transparent substrate is heated in a process chamber and a process gas stream is introduced into the process chamber. The apparatus generates a high frequency power output and a low frequency power output from a high frequency power supply and a low frequency power supply, respectively. The high frequency power output is generated at a frequency of about thirteen megahertz or more, and at a power from about one to five kilowatts, while the low frequency power output is generated at a frequency of about two megahertz or less, and at a power from about 300 to two kilowatts. The high frequency power output and the low frequency power output are superimposed and used to excite a plasma from the process gas stream at a pressure between about 0.4 Torr and 3 Torr, and at a temperature between about 250° C. and 450° C. to deposit a smooth thin film onto the transparent substrate.

7 Claims, 4 Drawing Sheets

DUAL FREQUENCY EXCITATION OF PLASMA FOR FILM DEPOSITION

BACKGROUND OF THE INVENTION

This invention relates to systems and methods of film deposition, and more particularly, to an improved system and method for rapid deposition of high quality films on a large area transparent substrate.

In recent years, liquid crystal cells have been developed to form high quality displays that are light-weight and consume little power. These liquid crystal cells typically include two glass substrates having a layer of a liquid crystal material sandwiched therebetween. Electrically conductive films are patterned on the substrates to form circuit elements such as thin film transistors (TFTs). The substrates can be connected to a power source to change the orientation of the liquid crystal material such that various areas of the liquid crystal display can be selectively energized using the TFTs.

In contrast to silicon substrates, the deposition of circuit elements onto a glass substrate requires that a layer of semiconductor channel material be fabricated on the glass substrate. Conductive paths to the gates are then deposited on the glass substrate. More specifically, for a back channel device, TFTs require the deposition of a gate dielectric layer over a patterned gate metal layer. Consecutively, an amorphous silicon (a-Si) layer may be deposited on top of the gate dielectric layer. Metal contacts may be deposited on the amorphous silicon layer. The amorphous silicon layer may have a thin layer of doped amorphous silicon deposited thereover to improve contacts with the overlying metal. A silicon nitride (SiN) or silicon oxide (SiO) layer may also be deposited over the amorphous silicon layer as an etch stop.

Reactors for depositing films onto large area glass substrates typically deploy plasma enhanced chemical vapor deposition, which uses a single high frequency power supply to induce a breakdown of process gases within a process chamber. Although the high energy produced by the high frequency power supply desirably heats up the film's top layer, it provides an insufficient amount of ion energy to provide a highly planar film. Additionally, as glass substrates are typically much larger than silicon substrates, the dimensions of the electrode may approach the wavelength of the power supply frequency. Such conditions lead to an uneven distribution of electrical discharge intensity over the surface of the glass substrate. This uneven distribution can produce an uneven film deposition on the substrate surface.

Due to the above factors, the films deposited on a glass substrate may have substantial surface roughness. Such roughness of the film reduces the film quality. Moreover, the roughness of the deposited film adversely affects electron mobility and ultimately results in a lower performance display.

SUMMARY OF THE INVENTION

An apparatus deposits a high quality film onto a transparent substrate in a reactor. The transparent substrate may be made of glass, quartz or a polymer such as plastic. The transparent substrate is heated in a process chamber and a process gas stream is introduced into the process chamber. The apparatus generates a high frequency power output and a low frequency power output from a high frequency power supply and a low frequency power supply, respectively. The high frequency power output and the low frequency power output are superimposed and used to excite a plasma from the process gas stream at a pressure between about 0.4 Torr and 3 Torr, and at a temperature between about 250° C. and 450° C. to deposit a smooth thin film onto the transparent substrate.

In one aspect of the invention, the high frequency power supply and the low frequency power supply each includes an impedance matching circuit and a filter coupled to the impedance matching circuit.

In another aspect of the invention, the high frequency power output is generated at a frequency of about thirteen megahertz or more, and at a power from about one to five kilowatts. Further, the low frequency power output is generated at a frequency of about two megahertz or less, and at a power from about 300 watts to two kilowatts.

In another aspect of the invention, the process gas may be a mixture of silane and oxygen, silane and nitrous oxide, TEOS and oxygen, or TEOS and nitrous oxide. Alternatively, the process gas may be a combination of silane, nitrogen and ammonia.

In yet another aspect of the invention, the substrate is supported on a susceptor which is grounded at the center. The susceptor may additionally be grounded at each of its four corners.

In another aspect of the invention, the substrate is positioned between a susceptor and a showerhead through which the process gas is introduced into the chamber. The susceptor is selectively connected to one of the low frequency and high frequency power supplies, while the showerhead is connected to the remaining one of the low frequency and high frequency power supplies.

Advantages of the present invention include the following. The film deposited with a dual frequency excited plasma is highly smooth. The smooth film provides a better interface to subsequently deposited layers and enhances electron mobility. The enhanced electron mobility increases the electrical performance of the display. The resulting film is also more stable. Other film properties such as density and stress are also improved while achieving fast deposition rates.

Other features and advantages of the invention will become apparent from the following description, including the drawings and claims.

DESCRIPTION

Generally, in operation of the present invention, a transparent substrate is supported in a vacuum deposition process chamber, and is heated to several hundred degrees Celsius (° C.) Deposition gases are injected into the chamber, and excited by a dual frequency power supply system. A plasma-enhanced chemical vapor deposition (PECVD) reaction occurs to deposit a thin film layer onto the transparent substrate. The deposited thin film layer may be a dielectric layer (such as SiN or SiO) or a semiconductor layer (such as a-Si).

The present invention may be used in conjunction with PECVD systems manufactured by Applied Komatsu Technology (AKT) of Santa Clara, Calif. The present invention may also be used with other commercially-available deposition systems. The transparent substrate may be made of glass, quartz or a polymer such as plastic. A common substrate size is approximately 550 by 650 millimeters (mm).

Figure 1:
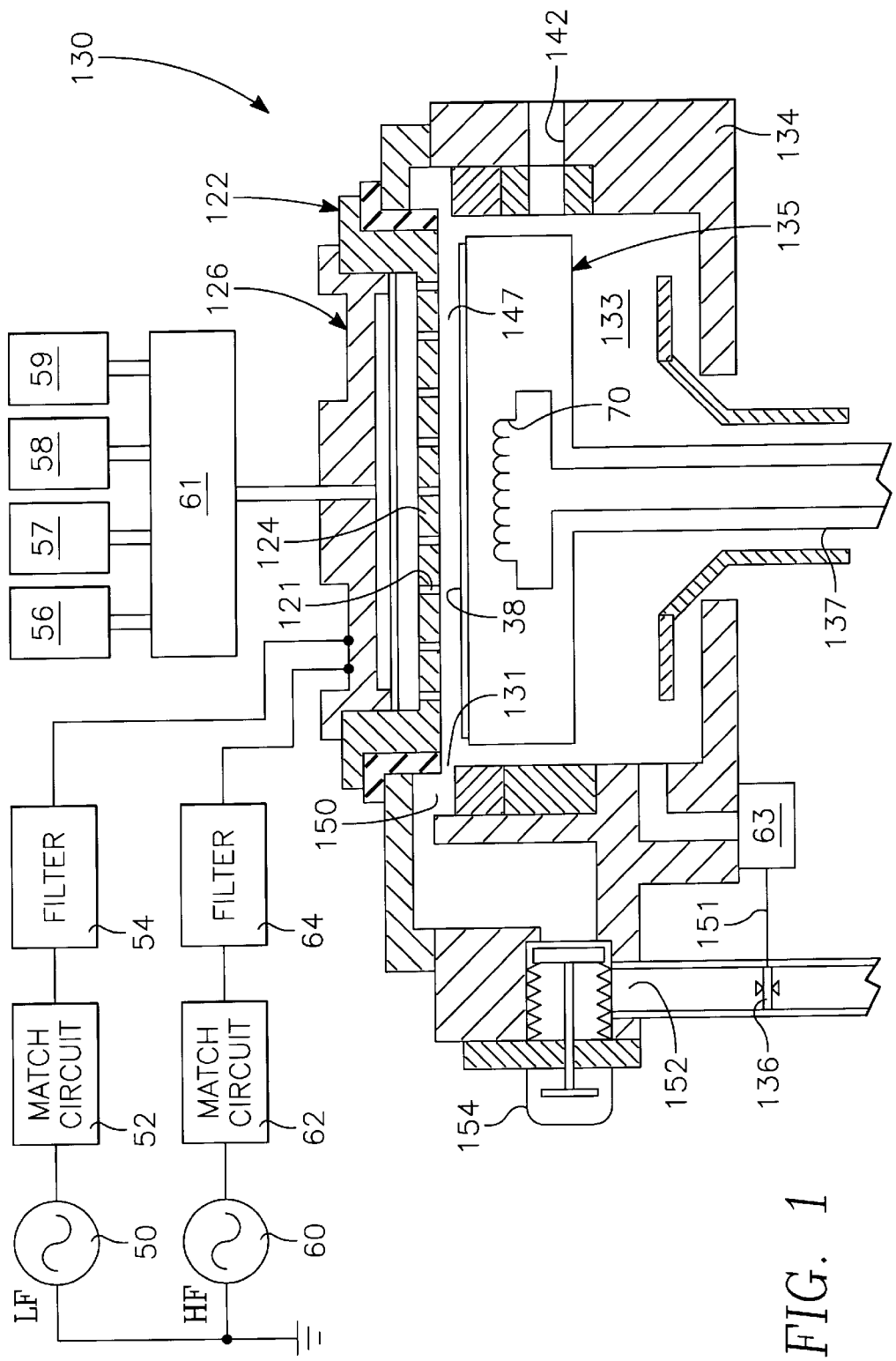
FIG. 1 is a cross-sectional view of a reactor in accordance with the present invention.

Turning now to FIG. 1, a PECVD apparatus 130 includes a susceptor 135 having a stem 137. The susceptor 135 is centered within a vacuum deposition process chamber 133. The susceptor 135 holds a transparent substrate 38, such as a glass panel, in a substrate processing or reaction region 141. A lift mechanism (not shown) is provided to raise and lower the susceptor 135. Commands to the lift mechanism are provided by a controller (not shown). The substrate 38 is transferred into and out of the chamber 133 through an opening 142 in a sidewall 134 of the chamber 133 by a robot blade (not shown). The substrate 38 is heated to a temperature between about 250° C. and 400° C. by a heater 70, which may be a resistive heater embedded in the susceptor 135. Alternatively, a lamp heater or other suitable heaters known to those skilled in the art may be used.

The deposition process gases flow into the chamber 133 through a gas source manifold 61 and a gas inlet manifold 126. The gas source manifold 61 receives gases from sources 56–59 which may supply silane ($SiH_4$), tetraethylorthosilane (TEOS), oxygen ($O_2$), nitrous oxide ($N_2O$), nitrogen ($N_2$) and ammonia ($NH_3$). The gas manifold 61 may generate as a process gas a mixture of silane and oxygen, silane and nitrous oxide, TEOS and oxygen, or TEOS and nitrous oxide. Alternatively, the process gas may be a combination of silane, nitrogen and ammonia. The process gas flows through a perforated blocker plate 124 and a number of holes 121 in a process gas distribution faceplate or showerhead 122. Various showerhead configurations may be used, including those shown in U.S. Pat. Nos. 4,854,263, 5,611,865 and 5,366,585, hereby incorporated by reference. The electrode spacing or the distance between the substrate surface and the discharge surface of the faceplate 122 is between about 400 to 1,500 mils. The process gas flow is indicated by small arrows in the substrate processing region 141 of FIG. 1. During operation, the chamber 133 is typically maintained at a pressure between about 0.4 Torr and 3 Torr, and at a temperature between about 250° C. and 450° C.

In the chamber shown in FIG. 1, a plasma is employed to enhance the deposition process. Accordingly, an appropriate plasma ignition circuit is required, preferably a dual frequency radio frequency (RF) power supply system. The dual frequency RF power supply system includes a low frequency (LF) RF power supply 50 and a high frequency (HF) RF power supply 60 which apply electrical power between the gas distribution faceplate 122 and susceptor 135 so as to excite the process gas mixture to form a plasma. The low frequency RF power supply 50 operates in a frequency range of about 2 MHZ or below, preferably between about 200 kHz and 500 kHz. The high frequency RF power supply 60 operates at a frequency range of about 13 MHZ or greater, preferably at 13.56 MHZ or its harmonics. The RF power supplies may operate at a fixed frequency, or may employ an adjustable frequency to allow for tuning the apparatus 130.

The output of the high frequency RF power supply 60 is provided to an impedance matching network 62, which is connected to a filter 64 for removing unwanted noise. The high frequency power supply 60, when used by itself, provides an insufficient amount of ion energy to effectuate a highly smooth film. The low frequency RF power supply 50, along with an associated impedance matching network 52 and a filter 54, is added to increase the amount of ion energy available. Such an increase in ion energy provides for an improved surface morphology of the deposited film.

A high frequency RF power of about one to five kilowatts, and a low frequency RF power of about 300 watts to two kilowatts, are applied to the faceplate 122 to produce a plasma. In combination, the low and high frequency power supplies 50 and 60, are responsible for reacting the constituents of the plasma to deposit a film on the surface of the transparent substrate 38.

It is to be noted that different-sized substrates require different RF power. Thus, the above specific power values are appropriate for a substrate with dimensions of about 550 mm×650 mm. The power requirement may increase for a larger substrate. For instance, at the same high and low frequencies, a substrate which is larger in area requires more power from each power supply.

The deposition process gases may be exhausted from the chamber through a slot-shaped orifice 131 surrounding the substrate processing region 141 into an exhaust plenum 150. From exhaust plenum 150, the gases flow by a vacuum shut-off valve 154 and into an exhaust outlet 152 which connects to an external vacuum pump (not shown).

A manometer 63 measures the pressure of gases in chamber 133. Of course, the manometer 63 could be replaced by numerous other types of pressure sensors. As an example, an ion gauge could be used. A governor 136 may be disposed in the exhaust stream to regulate the overall pressure in the chamber 133. A signal 151 from manometer 63 may be used as an input to an electrical controller of governor 136 so as to maintain the total chamber pressure constant.

Figure 2:
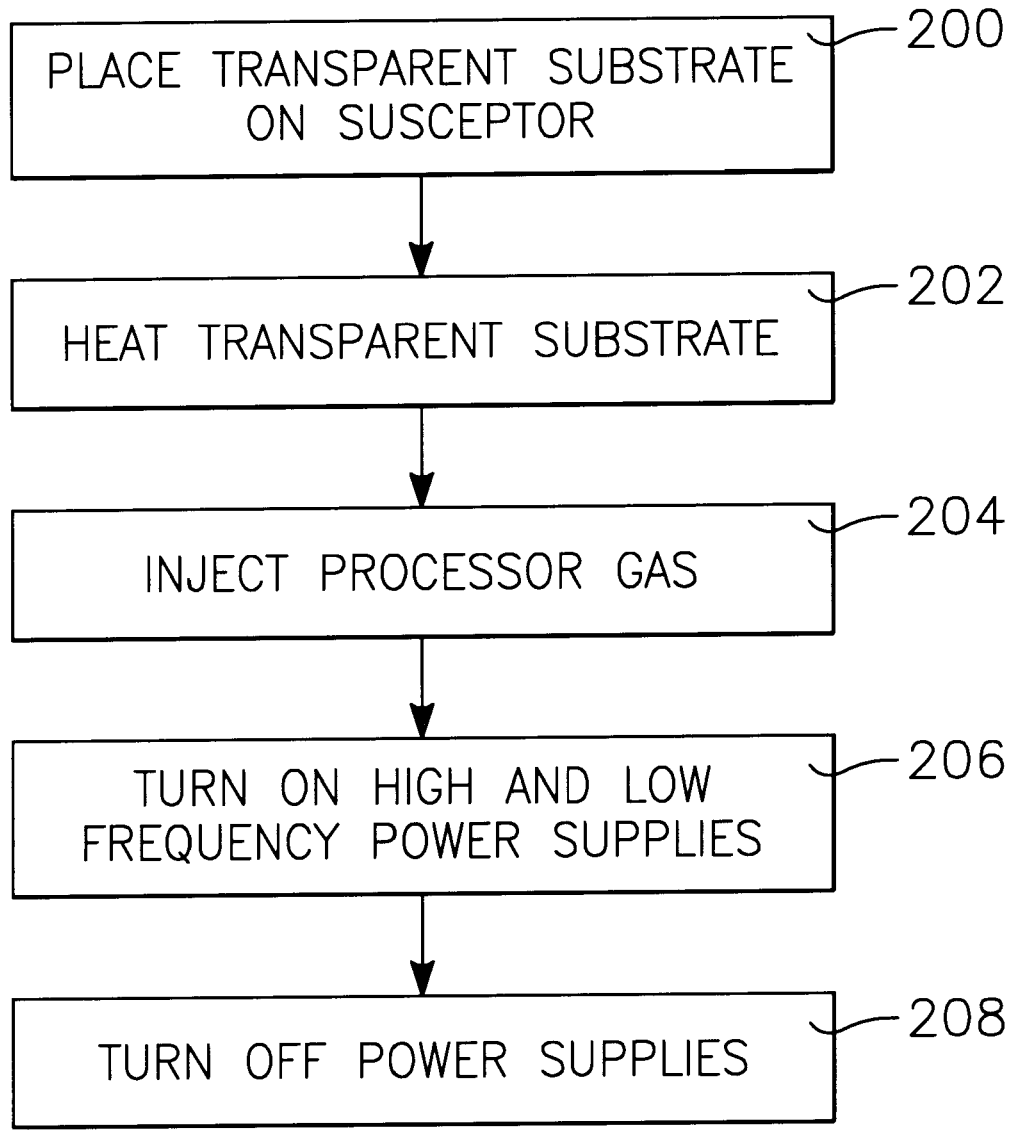
FIG. 2 is a flow chart illustrating a process for using dual frequency power supplies for depositing films onto large area transparent substrates.

Referring now to FIG. 2, a flow chart of a process for depositing films on the transparent substrate 38 using the dual frequency power supplies 50 and 60 is shown. First, the transparent substrate 38 is placed on the susceptor 135 (step 200). Next, the transparent substrate 38 is heated using the substrate heater 70 (step 202). The process gas flow from the process sources is equilibrated in the reaction chamber (step 204). The low frequency power supply 50 and the high frequency power supply 60 are turned on to excite a plasma inside the chamber, causing a film to be deposited onto the transparent substrate 38 (step 206). It is preferred that the high frequency power supply 60 be turned on first. However, the low frequency and high frequency power supplies may be turned on at the same time, or the low frequency power supply may be turned on first as desired. After completing the deposition of a film onto the transparent substrate 38, the low frequency and high frequency power supplies are turned off, preferably at the same time (step 208).

Figure 3A:
FIGS. 3A, 3B and 3C are schematic illustrations of various topologies in which the dual frequency power supplies are connected in circuits in the reactor.
Figure 3A:
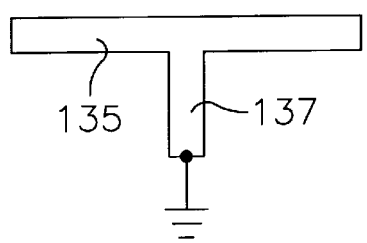
Figure 3B:
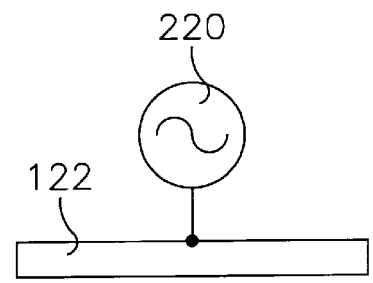
Figure 3B:
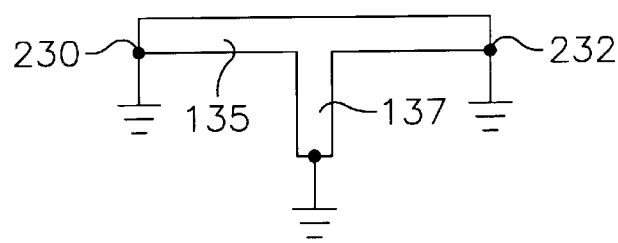
Figure 3C:
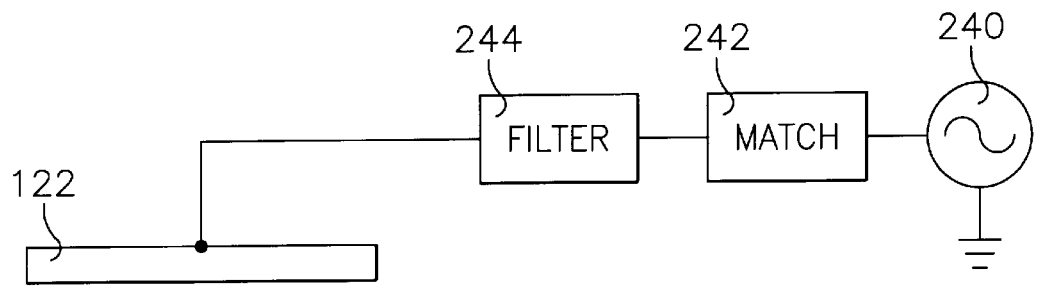
Figure 3C:
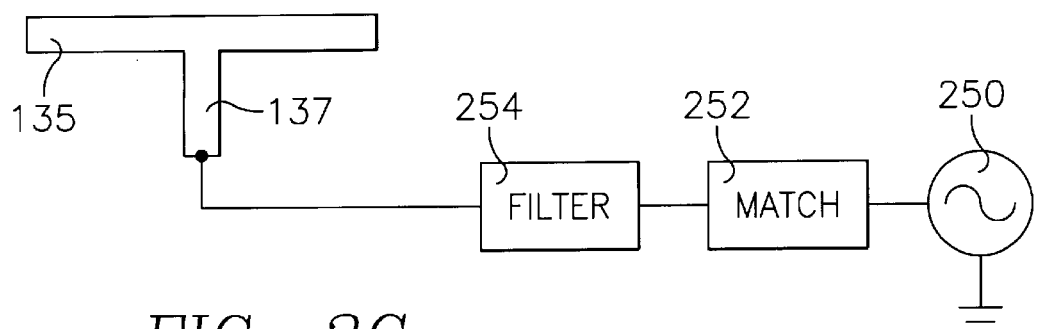

FIGS. 3A, 3B and 3C schematically illustrate various configurations of electrically coupling the dual power supplies to the showerhead 122 and the susceptor 135. Turning now to FIG. 3A, the outputs of the low frequency and the high frequency power supplies are superimposed and represented as a voltage source 210. The voltage source 210 is connected to a point on the showerhead 122. To provide an electrical return path to drain electrons collected on the susceptor 135, the stem 137, which supports the susceptor 135 and which is electrically connected to the susceptor 135, is grounded.

For large substrates, the configuration of FIG. 3B is preferred. In this configuration, a voltage source 220 which represents the superimposed output of the low frequency and the high frequency power supplies is applied to the center of the showerhead 122. Multiple electron return paths are provided at the stem 137 as well as at corners 230 and 232 of the susceptor 135. Moreover, electron return paths are also provided at the remaining two corners (not shown) of the four sided susceptor. Thus, the susceptor 135 is grounded at all four corners. The availability of multiple electron return paths allows for complete drainage of electrons from the susceptor 135.

Although FIGS. 3A and 3B show the application of the superimposed voltage source to the showerhead 122, the present invention also contemplates that the showerhead 122 and the susceptor 135 may be individually connected to different power supplies. In FIG. 3C, a power supply 240 operating at a first frequency is connected to an impedance matching circuit 242. The matching circuit 242 in turn is connected to a filter 244, which is connected to the showerhead 122. Correspondingly, a power supply 250 operating at a second frequency is connected to an impedance matching circuit 252. The matching circuit 252 is connected to a filter 254, which is connected to the susceptor 135. In the event that the first frequency is a high frequency, the second frequency is a low frequency, and in the event that the first frequency is a low frequency, the second frequency is a high frequency.

Thus, the outputs of the low frequency and high frequency power supplies may be superimposed and provided to the showerhead 122. Alternatively, one of the low frequency and high frequency power supplies may be connected to the showerhead 122, while the other of the low frequency and high frequency power supply may be connected to the susceptor 135.

A film deposited in accordance with the present invention is of higher quality than films deposited using reactors with a conventional single high frequency power supply, as shown below in Table 1. The first two columns of Table 1 show silicon nitride film properties achieved using a single high frequency (HF) power supply operating at 4000 W and 4800 W, respectively, at a temperature of about 320° C., and at a pressure of about 20 Torr. The last column of Table 1 shows the results in accordance with the present invention using a low and high frequency power supply system configured as shown in FIG. 3B and operating at about 400 kHz and about 13.6 MHZ, respectively, at a total power of about 4700 W, at a temperature of about 320° C. and a pressure of about 2.0 Torr.

TABLE 1

|  | 4000W HF | 4800W HF | 4000 HF & 700W LF |
|---|---|---|---|
| Dep Rate | 3700Å/min. | 4000Å/min. | 4000Å/min. |
| Stress | −0.8E9 dynes (D)/cm$^2$ | −4.5E9D/cm$^2$ | −6.5E9D/cm$^2$ |
| WER | 512Å/min. | 344Å/min. | 234Å/min. |
| Roughness (rms) | 1.0 nm | 1.74 nm | 0.73 nm |

As shown, the deposition rate of the reactor with the dual frequency power supply system, at 4000 Å/minute, is as high as that of the single HF power supply operating at 4800 W. In these particular examples, the stress measured on films produced using the dual frequency power supply system is greater than that of the films deposited using the single power supply system operating at 4000 W and 4800 W. This stress, along with the low wet etch rate (WER) and smoothness for the film deposited using the dual frequency power supply system, indicates that the film is stable and of high quality.

Significantly, the roughness of the film deposited with the dual frequency power supply system, measured as a root-mean-square (rms) average value, is superior to the roughness of films deposited using the single frequency power supply systems. The greater the roughness, the higher the resistance experienced by electrons crossing the deposited gate. Therefore, the smooth film deposited using the dual frequency power supply system supports greater electron mobility, leading to a better display.

Figure 4A:
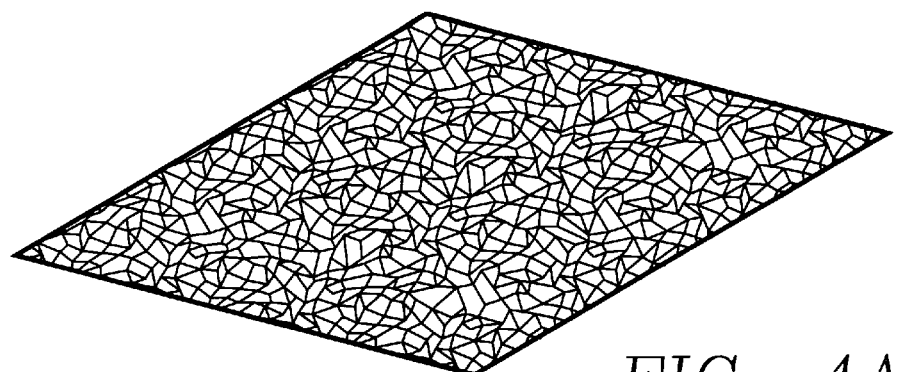
FIGS. 4A, 4B and 4C are three-dimensional renderings comparing the performance of a dual frequency power supply reactor with various single frequency power supply reactors in depositing films onto large area transparent substrates.
Figure 4B:
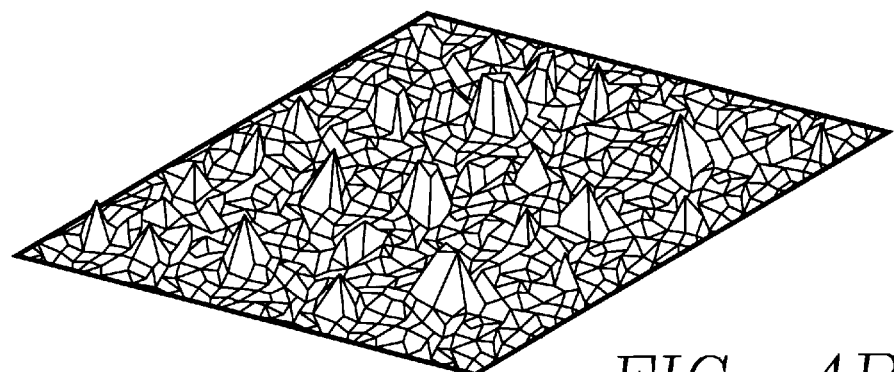

A three dimensional illustration of the surface roughness of films deposited by each reactor is shown below in FIGS. 4A–4C. FIGS. 4A and 4B are three-dimensional illustrations of film surfaces deposited using the single HF power supply reactors operating at 4000 W and 4800 W, respectively, as shown in Table 1. The surface of FIG. 4A is relatively rough with an rms roughness of 1.00 nm. The surface of FIG. 4B is even more jagged with an rms roughness of 1.74 nm.

Figure 4C:
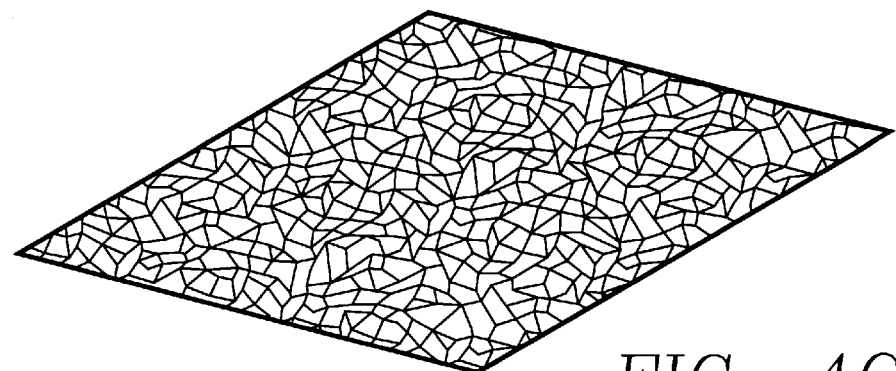

In contrast, as shown in FIG. 4C, the rms roughness of the surface of the film deposited using the dual frequency power supply system, at a total power of 4700 W, is 0.73 nm. Thus, even though the total power used was comparable to that of the 4800 W power supply, the dual frequency power supply reactor produced films which are more than 50% smoother than the corresponding 4800 W single frequency power supply.

The smooth film deposited with a dual frequency excited plasma provides a better bond to subsequently deposited layers and enhances electron mobility. The enhanced electron mobility increases the electrical performance of the display. The resulting film is also more stable.

Although the present invention has been illustrated and described using certain embodiments and sequences, various changes can be made to it without departing from the essence of the present invention. The present invention is applicable to numerous other types of CVD systems as well as systems using other deposition methods. Changes to the gas mixtures, temperatures and pressures are also contemplated. With respect to the power supply, instead of tuning the frequencies of the power supply, the impedance matching circuits may be tuned. Moreover, although the electrode spacing is disclosed as being between 400 to 1500 mils (100 to 380 mm), other suitable spacings may be used. Further, various sequences of heating and cycling of the power supplies can be carried out, depending upon the films and deposition sequences desired.

Such variations and changes will be apparent to those skilled in the art, and the invention is only to be limited by the appended claims.

What is claimed is:

1. An apparatus for depositing a film, comprising:
   a vacuum chamber in which a substrate to be processed may be positioned:
   a showerhead;
   a process gas source coupled to said vacuum chamber through said showerhead to introduce a gas stream into the chamber;
   a susceptor disposed in opposition to said showerhead for supporting a substrate and having four corners, wherein a center of said susceptor and said four corners are grounded through respective separate grounding paths;
   a first power supply outputting an oscillatory electrical signal at a first frequency to said showerhead;
   a second power supply outputting an oscillatory electrical signal at a second frequency lower than said first frequency to said showerhead, the outputs of said first and second power supplies combinable to excite a plasma from a process gas in said chamber to deposit the film on the substrate.

2. The apparatus of claim 1, wherein the first power supply and the second power supply each includes:
   an impedance matching circuit; and
   a filter coupled to the impedance matching circuit.

3. The apparatus of claim 1,
   wherein said showerhead has a center region, and
   wherein said showerhead is coupled to the outputs of said first and second power supplies proximally at said center region.

4. The apparatus of claim 1, wherein said chamber is controllable to a pressure between 0.4 and 3 Torr and further comprising a heater to heat said substrate in said chamber to a temperature between about 250° C. and 450° C.

5. An apparatus for depositing a film, comprising:
   a vacuum chamber in which a substrate to be processed may be positioned:
   a showerhead;
   a source of a process gas coupled to said vacuum chamber through said showerhead to introduce a gas stream of said process gas into the chamber;
   a susceptor disposed in opposition to said showerhead for supporting a substrate and having four corners, wherein a center of said susceptor and said four corners are grounded through respective separate grounding paths; and
   and at least one oscillatory electrical power supply connected to said showerhead to excite a plasma from said process gas in said chamber to deposit the film on the substrate.

6. The apparatus of claim 5, wherein said at least one oscillatory power supply comprises first and second oscillatory power supplies outputting respective oscillatory signals at a first frequency and a second frequency lower than said first frequency.

7. The apparatus of claim 6, wherein said first frequency is 13.56 MHz or a harmonic thereof and said second frequency is no more than 2 MHz.

* * * * *